(12) United States Patent
Shuto et al.

(10) Patent No.: US 10,066,059 B2
(45) Date of Patent: Sep. 4, 2018

(54) SEALING MATERIAL COMPOSITION FOR LED

(71) Applicant: NISSAN CHEMICAL INDUSTRIES, LTD., Tokyo (JP)

(72) Inventors: Keisuke Shuto, Funabashi (JP); Taku Kato, Funabashi (JP); Junpei Kobayashi, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/520,703

(22) PCT Filed: Sep. 8, 2015

(86) PCT No.: PCT/JP2015/075467
§ 371 (c)(1),
(2) Date: Apr. 20, 2017

(87) PCT Pub. No.: WO2016/063649
PCT Pub. Date: Apr. 28, 2016

(65) Prior Publication Data
US 2017/0306095 A1    Oct. 26, 2017

(30) Foreign Application Priority Data

Oct. 21, 2014    (JP) ................. 2014-214583

(51) Int. Cl.
| C08G 77/04 | (2006.01) |
| C08G 77/00 | (2006.01) |
| F21V 31/00 | (2006.01) |
| H01L 33/00 | (2010.01) |

(52) U.S. Cl.
CPC ............ *C08G 77/04* (2013.01); *C08G 77/80* (2013.01); *F21V 31/005* (2013.01); *C08G 2190/00* (2013.01); *H01L 33/0045* (2013.01)

(58) Field of Classification Search
CPC ......... C08G 77/18; C08G 77/16; C08G 77/80
See application file for complete search history.

(56) References Cited

U.S. PATENT DOCUMENTS 3,655,602 A * 4/1972 Sekmakas ................. C08F 8/42
524/251

FOREIGN PATENT DOCUMENTS

| JP | 2008-274272 A | 11/2008 |
| JP | 2011-202154 A | 10/2011 |
| JP | 2013-091772 A | 5/2013 |
| JP | 2014-129515 A | 7/2014 |
| JP | 2014-185293 A | 10/2014 |
| WO | 2012/117822 A1 | 9/2012 |

OTHER PUBLICATIONS

Dec. 15, 2015 Search Report issued in International Patent Application No. PCT/JP2015/075467.
Dec. 15, 2015 Written Opinion issued in International Patent Application No. PCT/JP2015/075467.

* cited by examiner

Primary Examiner — Kuo Liang Peng
(74) Attorney, Agent, or Firm — Oliff PLC

(57) ABSTRACT

A sealing material composition for LED has excellent heat-resistant transparency, adhesion, and crack resistance, and low sulfur gas permeability. A sealing material composition for LED has the following (A), (B), (C), and (D):
(A): polysiloxane containing units (1-1), (1-2), and (1-3):

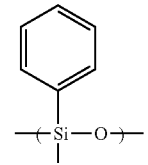

(1-1)

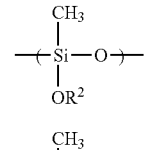

(1-2)

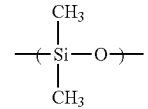

(1-3)

wherein $R^1$ is $C_{1-12}$ alkyl or $C_{6-20}$ aryl, $R^2$ is hydrogen, $C_{1-12}$ alkyl, or Si constituting main chain of polysiloxane as (A);
(B): polysiloxane containing units (2-1), (2-2), and (2-3):

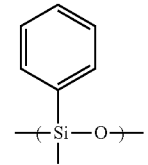

(2-1)

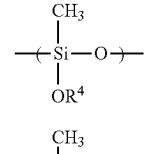

(2-2)

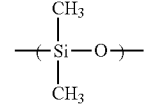

(2-3)

wherein $R^3$ and $R^4$ are each hydrogen, $C_{1-12}$ alkyl, or Si constituting main chain of polysiloxane as (B); (C): adhesive; and (D): condensation catalyst for silanol group.

9 Claims, No Drawings

SEALING MATERIAL COMPOSITION FOR LED

TECHNICAL FIELD

The present invention relates to a sealing material composition for an LED, a cured product of the composition which is obtained by curing the composition, and a an LED device comprising an LED element sealed with a cured product.

BACKGROUND ART

Since a silicone composition forms a cured product having excellent weather resistance, heat resistance, hardness, and rubber properties such as extension, the silicone composition is used for protection of an LED element, an electrode, a substrate, and the like, in an LED device. In the LED device, conductive silver or silver-containing alloy is used as the electrode. In order to improve brightness, the substrate may be plated with silver.

In general, the cured product of the silicone composition has high gas permeability. When the cured product is used in a high-brightness LED which exhibits high light intensity and generates a large amount of heat, there are problems such as discoloration of a sealing material due to corrosive gases in an environment and a reduction in brightness due to corrosion of silver which is used as the electrode or with which the substrate is plated.

In order to solve the problems, a thermosetting silicone resin composition for sealing an optical semiconductor including a silsesquioxane, a silicone alkoxy oligomer, and a condensation catalyst has been proposed as a thermosetting silicone resin composition for sealing an optical semiconductor having excellent gas barrier properties (Patent Document 1).

PRIOR ART DOCUMENTS

Patent Documents

Patent Document 1: Japanese Patent Application Publication No. 2011-202154 (JP 2011-202154 A)

SUMMARY OF THE INVENTION

Problem to be Solved by the Invention

Since a cured product of the thermosetting silicone resin composition for sealing an optical semiconductor including a silsesquioxane, a silicone alkoxy oligomer, and a condensation catalyst has high viscosity, there are problems in which handleability is low and large amounts of time and energy are required for curing. Further, there are a problem in terms of gas permeability (sulfuration resistance) and a problem of poor crack resistance.

An object of the present invention is to provide a sealing material composition for an LED having excellent heat-resistant transparency, adhesion, and crack resistance, and low sulfur gas permeability.

Means for Solving the Problems

The present invention provides as a first aspect, a sealing material composition for an LED comprising the following (A), (B), (C), and (D) components:

(A) component: a polysiloxane containing structural units of Formulae (1-1), (1-2), and (1-3):

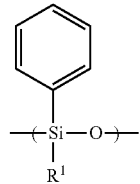

Formula (1-1)

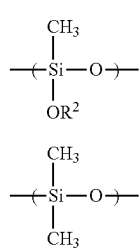

Formula (1-2)

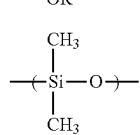

Formula (1-3)

(wherein $R^1$ is a $C_{1-12}$ alkyl group or a $C_{6-20}$ aryl group, $R^2$ is a hydrogen atom, a $C_{1-12}$ alkyl group, or a Si atom constituting a main chain of the polysiloxane as the (A) component, and the ratio of the number (s) of the unit structure of Formula (1-1), the ratio of the number (m) of the unit structure of Formula (1-2), and the ratio of the number (n) of the unit structure of Formula (1-3) satisfy $0.3 \leq s \leq 0.65$, $0.25 \leq m \leq 0.4$, and $0.1 \leq n \leq 0.3$, respectively, relative to the total number of all the unit structures constituting the polysiloxane as the (A) component of 1.0), (B) component: a polysiloxane containing structural units of Formulae (2-1), (2-2), and (2-3):

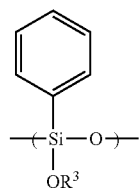

Formula (2-1)

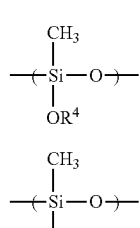

Formula (2-2)

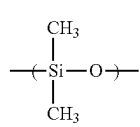

Formula (2-3)

(wherein $R^3$ and $R^4$ are each a hydrogen atom, a $C_{1-12}$ alkyl group, or a Si atom constituting a main chain of the polysiloxane as the (B) component, and the ratio of the number (t) of the unit structure of Formula (2-1), the ratio of the number (p) of the unit structure of Formula (2-2), and the ratio of the number (q) of the unit structure of Formula (2-3) satisfy $0.1 \leq t \leq 0.5$, $0.1 \leq p \leq 0.5$, and $0.1 \leq q \leq 0.5$, respectively, relative to the total number of all the unit structures constituting the polysiloxane as the (B) component of 1.0), (C) component: an adhesive, and (D) component: a condensation catalyst for a silanol group.

A second aspect of the present invention is the sealing material composition for an LED according to the first aspect, wherein $R^1$ in the (A) component is a phenyl group or a methyl group.

A third aspect of the present invention is the sealing material composition for an LED according to the first or second aspect, wherein the polysiloxane as the (A) component has a weight average molecular weight of 1,000 to 5,000.

A fourth aspect of the present invention is the sealing material composition for an LED according to any one of the first to third aspects, wherein the polysiloxane as the (B) component has a weight average molecular weight of 1,000 to 5,000.

A fifth aspect of the present invention is the sealing material composition for an LED according to any one of the first to fourth aspects, wherein the mixing ratio by mass of the (A) and (B) components is 0.2:0.8 to 0.8:0.2.

A sixth aspect of the present invention is the sealing material composition for an LED according to any one of the first to fifth aspects, wherein the adhesive as the (C) component is a silane having a mercapto group.

A seventh aspect of the present invention is the sealing material composition for an LED according to any one of the first to sixth aspects, wherein the condensation catalyst for a silanol group as the (D) component is an organometal compound.

An eighth aspect of the present invention is the sealing material composition for an LED according to any one of the first to seventh aspects, further comprising phenyltrialkoxysilane as an (E) component.

A ninth aspect of the present invention is an LED device comprising an LED element sealed with a cured product obtained by curing the sealing material composition for an LED according to any one of the first to eighth aspects.

Effects of the Invention

A cured product of a sealing material composition for an LED is applied to a device in which an LED element is surrounded by a silver reflector plate, and the device is filled with a sealing material. This sealing material is required to have adhesion and sulfuration resistance. A reduction in the performances is not preferable since a gas containing a sulfur component enters into the device, resulting in corrosion of the silver reflector plate.

In the present invention, a polysiloxane as an (A) component containing a specific amount of hydrolysis-condensation product of silane having a phenyl group and two hydrolysable groups and a polysiloxane as a (B) component containing a specific amount of hydrolysis-condensation product of silane having a phenyl group and three hydrolysable groups are mixed at a specific ratio. A combination of the specific polysiloxanes, a (C) component, and a (D) component exerts effects.

Unit structures of Formulae (1-2), (2-1), and (2-2) are derived from a silane having three hydrolysable groups, and have a linear structure or a three-dimensional structure. A Si—OR$^2$ group in Formula (1-2), a Si—OR$^3$ group in Formula (2-1), and a Si—OR$^4$ group in Formula (2-2) form a Si—OH group, a Si—OR group (wherein R is a $C_{1-12}$ alkyl group), or a siloxane bond of Si—O—Si.

A sealing material composition for an LED of the present invention is characterized by forming a cured product having excellent heat-resistant transparency, adhesion, and crack resistance, and low sulfur gas permeability. An LED device sealed with the cured product of the sealing material composition for an LED of the present invention has excellent reliability.

MODES FOR CARRYING OUT THE INVENTION

The present invention is a sealing material composition for an LED comprising a polysiloxane containing unit structures of Formula (1-1), (1-2), and (1-3) as an (A) component, a polysiloxane containing unit structures of Formula (2-1), (2-2), and (2-3) as a (B) component, an adhesive as a (C) component, and a condensation catalyst for a silanol group as a (D) component.

In Formula of the (A) component, $R^1$ is a $C_{1-12}$ alkyl group or a $C_{6-20}$ aryl group, $R^2$ is a hydrogen atom, a $C_{1-12}$ alkyl group, or a Si atom constituting a main chain of the polysiloxane as the (A) component, and the ratio of the number (s) of the unit structure of Formula (1-1), the ratio of the number (m) of the unit structure of Formula (1-2), and the ratio of the number (n) of the unit structure of Formula (1-3) satisfy $0.3 \leq s \leq 0.65$, $0.25 \leq m \leq 0.4$, and $0.1 \leq n \leq 0.3$, respectively, relative to the total number of all the unit structures constituting the polysiloxane as the (A) component of 1.0.

In Formula of the (B) component, $R^3$ and $R^4$ are each a hydrogen atom, a $C_{1-12}$ alkyl group, or a Si atom constituting a main chain of the polysiloxane as the (B) component, and the ratio of the number (t) of the unit structure of Formula (2-1), the ratio of the number (p) of the unit structure of Formula (2-2), and the ratio of the number (q) of the unit structure of Formula (2-3) satisfy $0.1 \leq t \leq 0.5$, $0.1 \leq p \leq 0.5$, and $0.1 \leq q \leq 0.5$, respectively, relative to the total number of all the unit structures constituting the polysiloxane as the (B) component of 1.0.

When $R^2$ is a Si atom constituting the main chain of the polysiloxane as the (A) component and $R^3$ and $R^4$ are a Si atom constituting the main chain of the polysiloxane as the (B) component, the Si atom is further bonded to an O atom to form a three-dimensional structure.

When $R^1$, $R^2$, $R^3$, and $R^4$ are a $C_{1-12}$ alkyl group, examples of the alkyl group include methyl group, ethyl group, propyl group, isopropyl group, butyl group, isobutyl group, tert-butyl group, pentyl group, hexyl group, heptyl group, octyl group, nonyl group, decyl group, undecyl group, and dodecyl group.

When $R^1$ is a $C_{6-20}$ aryl group, examples of the aryl group include phenyl group, tolyl group, xylyl group, naphthyl group, anthracenyl group, and phenanthryl group.

$R^1$ is preferably phenyl group or methyl group, and particularly preferably phenyl group since heat-resistant transparency and crack resistance are made excellent and sulfur gas permeability is reduced.

When the ratio of the number (s) of the unit structure of Formula (1-1) in the (A) component relative to the total number of all the unit structures constituting the polysiloxane as the (A) component of 1.0 is less than the lower limit, the sulfur gas permeability of the cured product is increased. When it is more than the upper limit, the cured product is clouded. When the ratio of the number (m) of the unit structure of Formula (1-2) is less than the lower limit, the sulfur gas permeability of the cured product is increased, and a problem in which tack (tackiness) remains on a surface of the cured product occurs. When it is more than the upper limit, the crack resistance of the cured product is reduced.

When the ratio of the number (n) of the unit structure of Formula (1-3) is less than the lower limit, the crack resistance of the cured product is reduced. When it is more than the upper limit, the sulfur gas permeability of the cured product is increased.

It is preferable that the siloxane compound as the (A) component used in the composition of the present invention has a weight average molecular weight of 1,000 to 5,000. When the weight average molecular weight is less than 1,000, curing in the cured product may be insufficient, and a problem such as increased sulfur gas permeability occurs. When the weight average molecular weight is more than 5,000, the viscosity of the polysiloxane compound as the (A) component is significantly increased, and handling is made difficult. In the present invention, the weight average molecular weight of the polysiloxane compound is a weight average molecular weight in terms of polystyrene determined by gel permeation chromatography (GPC) using tetrahydrofuran as a solvent.

The polysiloxane as the (A) component can be produced by a conventionally known technique. Specifically, the polysiloxane can be produced by a method in which a silane compound corresponding to the polysiloxane as the (A) component is subjected to a hydrolysis-condensation reaction in the presence of an acid or a base.

Examples of the silane compound for synthesis of the polysiloxane as the (A) component include phenylmethyldimethoxysilane, phenylethyldimethoxysilane, phenylpropyldimethoxysilane, phenylbutyldimethoxysilane, phenylpentyldimethoxysilane, phenylhexyldimethoxysilane, phenylheptyldimethoxysilane, phenyloctyldimethoxysilane, phenylnonyldimethoxysilane, phenyldecyldimethoxysilane, phenylundecyldimethoxysilane, phenyldodecyldimethoxysilane, phenylmethyldiethoxysilane, phenylethyldiethoxysilane, phenylpropyldiethoxysilane, phenylbutyldiethoxysilane, phenylpentyldiethoxysilane, phenylhexyldiethoxysilane, phenylheptyldiethoxysilane, phenyloctyldiethoxysilane, phenylnonyldiethoxysilane, phenyldecyldiethoxysilane, phenylundecyldiethoxysilane, phenyldodecyldiethoxysilane, phenylmethyldipropoxysilane, phenylethyldipropoxysilane, phenylpropyldipropoxysilane, phenylbutyldipropoxysilane, phenylpentyldipropoxysilane, phenylhexyldipropoxysilane, phenylheptyldipropoxysilane, phenyloctyldipropoxysilane, phenylnonyldipropoxysilane, phenyldecyldipropoxysilane, phenylundecyldipropoxysilane, phenyldodecyldipropoxysilane, phenylmethyldichlorosilane, phenylethyldichlorosilane, phenylpropyldichlorosilane, phenylbutyldichlorosilane, phenylpentyldichlorosilane, phenylhexyldichlorosilane, phenylheptyldichlorosilane, phenyloctyldichlorosilane, phenylnonyldichlorosilane, phenyldecyldichlorosilane, phenylundecyldichlorosilane, phenyldodecyldichlorosilane, methyltrimethoxysilane, methyltriethoxysilane, methyltripropoxysilane, methyltrichlorosilane, dimethyldimethoxysilane, dimethyldiethoxysilane, dimethyldipropoxysilane, and dimethyldichlorosilane.

The polysiloxane as the (A) component can be produced by the method in which the silane compound is subjected to a hydrolysis-condensation reaction in the presence of an acid or a base.

Examples of the acid include hydrochloric acid, acetic acid, formic acid, nitric acid, oxalic acid, sulfuric acid, phosphoric acid, polyphosphoric acid, polycarboxylic acid, trifluoromethanesulfonic acid, and an ion exchange resin. Examples of the base include sodium hydroxide, potassium hydroxide, aqueous ammonia, tetramethylammonium hydroxide, and tetraethylammonium hydroxide.

In the production method, an organic solvent can be used. Examples of the organic solvent include methanol, ethanol, 2-propanol, butanol, acetone, methyl ethyl ketone, tetrahydrofuran, 1,4-dioxane, toluene, xylene, propylene glycol monomethyl ether, and propylene glycol monomethyl ether acetate.

In the production method, water or a mixture of water with an alcohol may be added to promote the hydrolysis-condensation reaction of the silane compound. It is preferable that the alcohol be methanol, ethanol, 2-propanol, or butanol. The production method is promoted by heating. When the organic solvent is used, it is preferable that the reaction be carried out at a reflux temperature thereof.

When the ratio of the number (t) of the unit structure of Formula (2-1) in the (B) component relative to the total number of all the unit structures constituting the polysiloxane as the (B) component of 1.0 is less than the lower limit, the sulfur gas permeability of the cured product is increased. When it is more than the upper limit, the viscosity of the polysiloxane is increased, and handling is made difficult. When the ratio of the number (p) of the unit structure of Formula (2-2) is less than the lower limit, the sulfur gas permeability of the cured product is increased, and a problem in which tack (tackiness) remains on a surface of the cured product occurs. When it is more than the upper limit, the sulfur gas permeability of the cured product is increased. When the ratio of the number (q) of the unit structure of Formula (2-3) is less than the lower limit, the crack resistance of the cured product is reduced. When it is more than the upper limit, the sulfur gas permeability is increased.

It is preferable that the siloxane compound as the (B) component used in the composition of the present invention has a weight average molecular weight of 1,000 to 5,000. A polysiloxane having a weight average molecular weight which is less than 1,000 may be instable, and the storage stability may be deteriorated. When the weight average molecular weight is more than 5,000, a problem in terms of thermosetting properties occurs. In the present invention, the weight average molecular weight of the polysiloxane is a weight average molecular weight in terms of polystyrene determined by gel permeation chromatography (GPC) using tetrahydrofuran as a solvent.

The polysiloxane as the (B) component can be produced by a conventionally known technique. Specifically, the polysiloxane can be produced by a method in which a silane compound corresponding to the polysiloxane as the (B) component is subjected to a hydrolysis-condensation reaction in the presence of an acid or a base.

Examples of the silane compound for synthesis of the polysiloxane as the (B) component include phenyltrimethoxysilane, phenyltriethoxysilane, phenyltripropoxysilane, phenyltrichlorosilane, methyltrimethoxysilane, methyltriethoxysilane, methyltripropoxysilane, methyltrichlorosilane, dimethyldimethoxysilane, dimethyldiethoxysilane, dimethyldipropoxysilane, and dimethyldichlorosilane.

The polysiloxane as the (B) component can be produced by the method in which the silane compound is subjected to a hydrolysis-condensation reaction in the presence of an acid or a base.

Examples of the acid include hydrochloric acid, acetic acid, formic acid, nitric acid, oxalic acid, sulfuric acid, phosphoric acid, polyphosphoric acid, polycarboxylic acids, trifluoromethanesulfonic acid, and an ion exchange resin. Examples of the base include sodium hydroxide, potassium hydroxide, aqueous ammonia, tetramethylamonium hydroxide, and tetraethylammonium hydroxide.

In the production method, an organic solvent can be used. Examples of the organic solvent include methanol, ethanol, 2-propanol, butanol, acetone, methyl ethyl ketone, tetrahydrofuran, 1,4-dioxane, toluene, xylene, propylene glycol monomethyl ether, and propylene glycol monomethyl ether acetate.

In the production method, water or a mixture of water with an alcohol may be added to promote the hydrolysis-condensation reaction of the silane compound. It is preferable that the alcohol be methanol, ethanol, 2-propanol, or butanol. The production method is promoted by heating. When the organic solvent is used, it is preferable that the reaction be carried out at a reflux temperature thereof.

As the polysiloxane as the (B) component, glass resin, trade name GR-630S available from Techneglas may be used.

The mixing ratio by mass of the (A) and (B) components is preferably 0.2:0.8 to 0.8:0.2.

The content of the polysiloxane as the (A) component is preferably 10% by mass to 90% by mass, and more preferably 20% by mass to 80% by mass. When the content is less than 20% by mass, the sulfur gas permeability of the cured product is increased. When the content is more than 80% by mass, the crack resistance is reduced.

The content of the polysiloxane as the (B) component is preferably 10% by mass to 90% by mass, and more preferably 20% by mass to 80% by mass. When the content is less than 20% by mass, tack occurs on the surface of the cured product. When the content is more than 80% by mass, there may be a problem of cracking of the cured product.

The adhesive as the (C) component may be used to improve adhesion of the cured product to a substrate in contact with the cured product during curing. In particular, when silver or silver-containing alloy is used as an electrode in an LED device and a substrate is plated with silver to improve brightness, the adhesion of the composition of the present invention can be enhanced by use of a siloxane compound having a mercapto group. Examples of the silane compound having a mercapto group include 3-mercaptoalkyltrialkoxysilane. The alkyl group is preferably a $C_{1-12}$ alkyl group. Examples thereof include methyl group, ethyl group, and propyl group. The alkoxy group is preferably a $C_{1-12}$ alkoxy group. Examples thereof include methoxy group, ethoxy group, propoxy group, and isopropoxy group. In the composition of the present invention, the content of the adhesive as the (C) component is not particularly limited, but is preferably within a range of 0.01 parts by mass to 10 parts by mass relative to the total amount of the (A) and (B) components of 100 parts by mass.

The condensation catalyst for a silanol group as the (D) component is not particularly limited as long as it is a catalyst which is used in condensation of a silanol group, that is, a hydroxy group bonded to a Si atom, or a hydrolyzable alkoxy group. It is preferable that the condensation catalyst for a silanol group as the (D) component be an organometal compound from the viewpoints of excellent stability at room temperature and curing properties. It is preferable that the condensation catalyst for a silanol group as the (D) component be an organometal compound containing at least one selected from the group consisting of an organotin compound and an organoaluminum compound from the viewpoints of excellent curing properties and stability at room temperature. Two or more kinds thereof may be mixed and used.

Examples of an organotin catalyst include dibutyltin diacetate, dibutyltin dioctate, dibutyltin dilaurate, dibutyltin diacetate, and dibutyltin maleate. Examples of a commercially available product thereof include trade name NEOSTANN U-100, trade name NEOSTANN U-130, trade name NEOSTANN U-200, trade name NEOSTANN U-220H, trade name NEOSTANN U-303, trade name NEOSTANN U-700, trade name NEOSTANN U-810, trade name NEOSTANN U-820, trade name NEOSTANN U-830, trade name NEOSTANN U-700ES, trade name NEOSTANN SCAT-24, trade name NEOSTANN SCAT-31A, and trade name NEOSTANN S-1 (all available from Nitta Kasei Co., Ltd.). Since excellent curing properties, heat-resistant transparency, adhesion, and crack resistance, and low sulfur gas permeability are achieved and sufficiently long pot life can be secured, dibutyltin diacetate, dibutyltin dioctate, dibutyltin dilaurate, trade name NEOSTANN U-100, and trade name NEOSTANN U-130 are preferable.

Examples of an organoaluminum catalyst include tris(acetylacetonate)aluminum, tri(ethylacetoacetate)aluminum, ethylacetoacetate aluminum diisopropylate, aluminum sec-butyrate, aluminum triethoxide, and aluminum triisopropoxide. Examples of a commercially available product thereof include trade name DX-9710 (available from Shin-Etsu Chemical Co., Ltd.).

The content of the condensation catalyst for a silanol group as the (D) component is preferably 0.01 parts by mass to 40 parts by mass, and more preferably 0.1 parts by mass to 40 parts by mass, relative to the total amount of the (A) and (B) components of 100 parts by mass. When a plurality of condensation catalysts for a silanol group are used in combination, the condensation catalysts can be each separately used to obtain the composition of the present invention containing the condensation catalysts.

As the (E) component, phenyltrialkoxysilane may be contained. The alkoxy group is a $C_{1-12}$ alkoxy group. Examples thereof include methoxy group, ethoxy group, propoxy group, and isopropoxy group. The (E) component can function as a reactive diluent. Since excellent heat-resistant transparency, adhesion, crack resistance, and workability are achieved and the viscosity can be reduced, phenyltrimethoxysilane, phenyltriethoxysilane, and phenyitripropoxysilane are preferable.

The content of the (E) component is preferably 0.1 parts by mass to 60 parts by mass, and more preferably 1 part by mass to 60 parts by mass, relative to the total amount of the (A) and (B) components of 100 parts by mass. When the content of the (E) component is less than 1 part by mass, the viscosity of the composition of the present invention cannot be reduced, and workability is deteriorated. When the content of the (E) component is more than 60 parts by mass, sulfur gas permeability is increased and corrosion of a substrate and the like is increased.

In addition to the aforementioned components, the sealing material composition for an LED of the present invention may contain an additive, if necessary, within a range in which the object and effects of the present invention are not impaired. Examples of the additive include an inorganic filler, an antioxidant, an ultraviolet absorber, thermal and photostabiliers, a dispersant, an antistat, a polymerization inhibitor, an antifoaming agent, a solvent, an inorganic phosphor, a radical inhibitor; a surfactant, a conductivity-imparting agent, a pigment, a dye, and a metal deactivator. The additives are not particularly limited.

A method for producing the sealing material composition for an LED of the present invention is not particularly limited as long as the (A), (B), (C), (D), and (E) components are homogeneously mixed. When the composition of the present invention is produced in a two-component type, a first component may include the (A), (B), and (C) components, and the (E) component which can be used if necessary, and a second component may include the (D) component. If necessary, the first and/or second component may include the additive.

The cured product obtained from the sealing material composition for an LED of the present invention and an LED device in which an LED element is sealed with the cured product are also subjects of the present invention. The sealing material composition for an LED of the present invention can be cured by heating. It is preferable that the temperature for curing the sealing material composition for an LED of the present invention be about 80° C. to 200° C. A method for the heating treatment is not particularly limited. Examples thereof include a method using a hot plate or an oven in an appropriate atmosphere, that is, in an air, in an inert gas such as nitrogen, or in vacuo.

The sealing material composition for an LED of the present invention can be used for sealing an LED. An LED element in which the sealing material composition for an LED of the present invention can be applied is not particularly limited. A method for applying the sealing material composition for an LED of the present invention to an LED element is not particularly limited. For example, the sealing material composition for an LED of the present invention can be used as an optical lens, in addition to application other than for sealing an LED.

EXAMPLES

The weight average molecular weight of each copolymer to be obtained in the following Synthesis Examples was determined from a result measured by gel permeation chromatography (GPC).
Apparatus: GPC system manufactured by Shimadzu Corporation
GPC Column: Shodex (registered trademark) KF-804L and 803L
Column temperature: 40° C.
Solvent: tetrahydrofuran
Flow rate: 1 mL/min
Standard sample: polystyrene Synthesis Example 1

In a reactor, 80.73 g (0.330 mol) of diphenyldimethoxysilane, 30.0 g (0.22 mol) of methyltrimethoxysilane, and 22.06 g (0.184 mol) of dimethyldimetboxysilane were placed, and 0.44 g (7.0 mmol) of acetic acid and 46.30 g (2.569 mol) of water were then placed. The mixture was stirred at room temperature for 1 hour. Subsequently, 119.2 g of toluene and 2.06 g (37.0 mmol) of potassium hydroxide were added, and the mixture was heated and refluxed for 3 hours. The mixture was cooled to room temperature, and 147 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 90.2 g (yield: 96%) of product as a transparent liquid. The weight average molecular weight (Mw) of the obtained polysiloxane was 2,500. Hereinafter the polysiloxane is referred to as A-1.

Synthesis Example 2

In a reactor, 32.29 g (0.132 mol) of diphenyldimethoxysilane, 8.1 g (0.059 mol) of methyltrimethoxysilane, and 3.44 g (0.029 mol) of dimethyldimethoxysilane were placed, and 0.13 g (2.0 mmol) of acetic acid and 13.89 g (0.771 mol) of water were then placed. The mixture was stirred at room temperature for 1 hour. Subsequently, 43.59 g of toluene and 0.245 g (4.1 mmol) of potassium hydroxide were added, and the mixture was heated and refluxed for 3 hours. The mixture was cooled to room temperature, and 11.02 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 30.5 g (yield: 94%) of product as a transparent liquid. The weight average molecular weight (Mw) of the obtained polysiloxane was 2,200. Hereinafter, the polysiloxane is referred to as A-2.

Synthesis Example 3

In a reactor, 29.90 g (0.122 mol) of diphenyldimethoxysilane, 10.0 g (0.073 mol) of methyltrimethoxysilane, and 5.88 g (0.049 mol) of dimethyldimethoxysilane were placed, and 0.15 g (2.0 mmol) of acetic acid and 15.43 g (0.856 mol) of water were then placed. The mixture was stirred at room temperature for 1 hour. Subsequently, 45.78 g of toluene and 0.275 g (5.0 mmol) of potassium hydroxide were added, and the mixture was heated and refluxed for 3 hours. The mixture was cooled to room temperature, and 12.25 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 31.8 g (yield: 96%) of product as a transparent liquid. The weight average molecular weight (Mw) of the obtained polysiloxane was 2,000. Hereinafter, the polysiloxane is referred to as A-3.

Synthesis Example 4

In a reactor, 35.88 g (0.147 mol) of diphenyldimethoxysilane, 8.8 g (0.065 mol) of methyltrimethoxysilane, and 9.88 g (0.082 mol) of dimethyldimethoxysilane were placed, and 0.18 g (3.0 mmol) of acetic acid and 18.52 g (1.028 mol) of water were then placed. The mixture was stirred at room temperature for 1 hour. Subsequently, 81.70 g of toluene and 0.825 g (15.0 mmol) of potassium hydroxide were added, and the mixture was heated and refluxed for 3 hours. The mixture was cooled to room temperature, and 58.78 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 38.2 g (yield: 96%) of product as a transparent liquid. The weight average molecular weight (Mw) of the obtained polysiloxane was 2,200. Hereinafter, the polysiloxane is referred to as A-4.

Synthesis Example 5

In a reactor, 21.53 g (0.088 mol) of diphenyldimethoxysilane, 6.00 g (0.044 mol) of methyltrimethoxysilane, and 10.59 g (0.088 mol) of dimethyldimethoxysilane were placed, and 0.13 g (2.0 mmol) of acetic acid and 13.89 g (0.711 mol) of water were then placed. The mixture was stirred at room temperature for 1 hour. Subsequently, 48.12 g of toluene and 0.330 g (6.0 mmol) of potassium hydroxide were added, and the mixture was heated and refluxed for 3 hours. The mixture was cooled to room temperature, and 14.69 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 28.3 g (yield: 88%) of product as a transparent liquid. The weight average molecular weight (Mw) of the obtained polysiloxane was 1,500. Hereinafter, the polysiloxane is referred to as A-5.

Synthesis Example 6

In a reactor, 35.88 g (0.147 mol) of diphenyldimethoxysilane, 10.0 g (0.073 mol) of methyltrimethoxysilane, and 17.65 g (0.147 mol) of dimethyldimethoxysilane were placed, and 0.22 g (4.0 mmol) of acetic acid and 23.15 g (1.285 mol) of water were then placed. The mixture was stirred at room temperature for 1 hour. Subsequently, 63.53 g of toluene and 1.03 g (18.0 mmol) of potassium hydroxide were added, and the mixture was heated and refluxed for 3 hours. The mixture was cooled to room temperature, and 73.47 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 40.3 g (yield: 89%) of product as a transparent liquid. The weight average molecular weight (Mw) of the obtained polysiloxane was 2,400. Hereinafter, the polysiloxane is referred to as A-6.

Synthesis Example 7

In a reactor, 35.88 g (0.147 mol) of diphenyldimethoxysilane, 5.0 g (0.037 mol) of methyltrimethoxysilane, and 22.06 g (0.184 mol) of dimethyldimethoxysilane were placed, and 0.22 g (4.0 mmol) of acetic acid and 23.15 g (1.285 mol) of water were then placed. The mixture was stirred at room temperature for 1 hour. Subsequently, 64.12 g of toluene and 1.03 g (18.0 mmol) of potassium hydroxide were added, and the mixture was heated and refluxed for 3 hours. The mixture was cooled to room temperature, and 73.47 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 42.5 g (yield: 95%) of product as a transparent liquid. The weight average molecular weight (Mw) of the obtained polysiloxane was 2,800. Hereinafter, the polysiloxane is referred to as A-7.

Synthesis Example 8

In a reactor, 25.12 g (0.103 mol) of diphenyldimethoxysilane, 2.0 g (0.015 mol) of methyltrimethoxysilane, and 3.53 g (0.029 mol) of dimethyldimethoxysilane were placed, and 0.09 g (1.0 mmol) of acetic acid and 9.26 g (0.514 mol) of water were then placed. The mixture was stirred at room temperature for 1 hour. Subsequently, 45.97 g of toluene and 0.41 g (7.0 mmol) of potassium hydroxide were added, and the mixture was heated and refluxed for 3 hours. The mixture was cooled to room temperature, and 73.47 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 21.8 g (yield: 93%) of product as a white solid. The weight average molecular weight (Mw) of the obtained polysiloxane was 1,300. Hereinafter, the polysiloxane is referred to as A-8.

Synthesis Example 9

In a reactor, 14.35 g (0.059 mol) of diphenyldimethoxysilane, 4.0 g (0.029 mol) of methyltrimethoxysilane, and 24.71 g (0.206 mol) of dimethyldimethoxysilane were placed, and 0.18 g (3.0 mmol) of acetic acid and 18.52 g (1.028 mol) of water were then placed. The mixture was stirred at room temperature for 1 hour. Subsequently, 64.59 g of toluene and 0.83 g (15.0 mmol) of potassium hydroxide were added, and the mixture was heated and refluxed for 3 hours. The mixture was cooled to room temperature, and 58.78 g of ethyl acetate solution containing 1.2% by mass acetic acid was added to perform a neutralization reaction. After then, ethyl acetate and water were added, and the mixture was stirred and then left to stand. Water of the lower phase was taken out, and an organic phase of the upper phase was repeatedly washed with water. Water was taken out, and a substance having a low boiling point was then distilled off under reduced pressure by heating from the organic phase, to obtain 25.1 g (yield: 87%) of product as a white solid. The weight average molecular weight (Mw) of the obtained polysiloxane was 900. Hereinafter, the polysiloxane is referred to as A-9.

Diphenyldimethoxysilane, methyltrimethoxysilane, and dimethyldimethoxysilane used in Synthesis Examples are available from Tokyo Chemical Industry Co., Ltd., and acetic acid, toluene, potassium hydroxide, and ethyl acetate are available from JUNSEI CHEMICAL CO., LTD.

Trade name GR-630S used in the following Examples is available from Techneglas, phenyltrimethoxysilane, 3-mercaptopropyltrimethoxysilane, and dibutyltin diacetate are available from Tokyo Chemical Industry Co., Ltd., and trade name U-130 is available from Nitto Kasei Co., Ltd. Trade name GR-630S is a polysiloxane as a (B) component. An organic group corresponding to $R^3$ is an ethyl group, and a chemical group corresponding to is a hydrogen atom. The ratio of the number (t) of a unit structure of Formula (2-1), the ratio of the number (p) of a unit structure of Formula (2-2), and the ratio of the number (q) of a unit structure of Formula (2-3) satisfy t=0.303, p=0.333, and q=0.364, respectively, relative to the total number of all the unit structures constituting the polysiloxane as the (B) component of 1.0. The weight average molecular weight of the polysiloxane of trade name G-630S is 2,600.

Trade name U-130 is a (D) component. The component is 1,1,3,3-tetrabutyl-1,3-dodecanoyldistannoxane, $[Bu_2Sn(OCO(CH_2)_{10}CH_3)]_2O$.

Example 1

5 parts by mass of A-1 prepared in Synthesis Example 1 as an (A) component, 5 parts by mass of trade name GR-630S as the (B) component, 0.1 parts by mass of 3-mercaptopropyltrimethoxysilane as a (C) component, and 3 parts by mass of dibutyltin diacetate as the (D) component were mixed to prepare a sealing material composition for an LED.

Example 2

5 parts by mass of A-2 prepared in Synthesis Example 2 as the (A) component, 5 parts by mass of trade name GR-630S as the (B) component, 0.1 parts by mass of 3-mercaptopropyltrimethoxysilane as the (C) component, and 3 parts by mass of dibutyltin diacetate as the (D) component were mixed to prepare a sealing material composition for an LED.

Example 3

5 parts by mass of A-3 prepared in Synthesis Example 3 as the (A) component, 5 parts by mass of trade name GR-630S as the (B) component, 0.1 parts by mass of 3-mercaptopropyltrimethoxysilane as the (C) component, and 3 parts by mass of dibutyltin diacetate as the (D) component were mixed to prepare a sealing material composition for an LED.

Example 4

5 parts by mass of A-1 prepared in Synthesis Example 1 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as an (E) component were mixed to prepare a sealing material composition for an LED.

Example 5

5 parts by mass of A-2 prepared in Synthesis Example 2 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Example 6

5 parts by mass of A-3 prepared in Synthesis Example 3 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Example 7

5 parts by mass of A-1 prepared in Synthesis Example 1 as the (A) component, 4.5 parts by mass of trade name GR-630S as the (B) component, 0.1 parts by mass of 3-mercaptopropyltrimethoxysilane as the (C) component, and 3 parts by mass of U-130 as the (D) component were mixed to prepare a sealing material composition for an LED.

Example 8

5 parts by mass of A-1 prepared in Synthesis Example 1 as the (A) component, 4.5 parts by mass of trade name GR-630S as the (B) component, 0.1 parts by mass of 3-mercaptopropyltrimethoxysilane as the (C) component, 3 parts by mass of U-130 as the (D) component, and 5 parts by mass of phenyltrimethoxysilane as the (E) component were mixed to prepare a sealing material composition for an LED.

Comparative Example 1

5 parts by mass of A-4 prepared in Synthesis Example 4 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 2

5 parts by mass of A-5 prepared in Synthesis Example 5 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 3

5 parts by mass of A-6 prepared in Synthesis Example 6 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 4

5 parts by mass of A-7 prepared in Synthesis Example 7 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 5

5 parts by mass of A-8 prepared in Synthesis Example 8 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 6

5 parts by mass of A-9 prepared in Synthesis Example 9 as the (A) component, 4.5 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 7

10 parts by mass of trade name GR-630S as the (B) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the (E) component were mixed to prepare a sealing material composition for an LED.

Comparative Example 8

10 parts by mass of trade A-1 prepared in. Synthesis Example 1 as the (A) component, 0.1 parts by mass of 3-mercaptopropyltrimethoxysilane as the (C) component, 3 parts by mass of dibutyltin diacetate as the (D) component, and 5 parts by mass of phenyltrimethoxysilane as the component were mixed to prepare a sealing material composition for an LED.

Comparative Example 9

5 parts by mass of trade A-1 prepared in Synthesis Example 1 as the (A) component, 4.5 parts by mass of GR-630S as the (B) component, 3 parts by mass of dibutyltin diacetate as the (D) component, and 5 parts by mass of phenyltrimethoxysilane as the (E) component were mixed to prepare a sealing material composition for an LED.

Comparative Example 10

5 parts by mass of A-1 prepared in Synthesis Example 1 as the (A) component, 5 parts by mass of trade name GR-630S as the (B) component, 0.1 parts by mass of 3-mercaptopropyltrimethoxysilane as the (C) component, and 5 parts by mass of phenyltrimethoxysilane as the (E) component were mixed to prepare a sealing material composition for an LED.

Preparation of Cured Product

For evaluation of heat-resistant transparency, each of the sealing material compositions for an LED of the present invention prepared in Examples 1 to 8 and the sealing material compositions for an LED prepared in Comparative Examples 1 to 10 was baked by a hot plate at 130° C. for 1 hour, and then at 150° C. for 4 hours, to prepare a cured film with a thickness of 1 mm on an alkali-free glass substrate. For evaluation of sulfur gas permeability, each of the sealing material compositions for an LED of the present invention prepared in Examples 1 to 8 and the sealing material compositions for an LED prepared in Comparative Examples 1 to 10 was baked by a hot plate at 130° C. for 1 hour, and then at 150° C. for 4 hours, to prepare a cured film with a thickness of 1 mm on a silver substrate.

Evaluation of Heat-Resistant Transparency

The transmittance of each of the obtained cured films with a thickness of 1 mm at a wavelength of 400 nm was measured with an ultraviolet-visible spectrophotometer UV-3100PC manufactured by Shimadzu Corporation. After the measurement, the cured film was heated in a convection oven (in air) set to a temperature of 190° C. for 300 hours. The transmittance of the cured film after heating was measured. When the transmittance was 90% or more, the cured film was evaluated as a cured film having high transparency even after a heating treatment of the formed cured film, and represented by "○." A cured film having a transmittance after heating of less than 90% or a cured film which was cracked during evaluation of a heat-resistant transparency test was evaluated as a cured film having no heat-resistant transparency, and was evaluated as "×".

Evaluation of Sulfur Gas Permeability 3 g of sulfur was disposed at a bottom of a 1-L desiccator. The silver substrate was attached to a lid of the desiccator so that the cured film prepared on the silver substrate was faced toward the bottom of the desiccator. The desiccator was put into an oven set to a temperature of 80° C. and left for 24 hours. Discoloration of the silver substrate was visually observed. When the discoloration was not confirmed, the sulfur gas permeability was judged to be low, and evaluated as "○." In contrast, when the discoloration was confirmed, the sulfur gas permeability was judged to be high, and evaluated as "×."

Evaluation of Adhesion

The cured film prepared on the silver substrate after the sulfur gas permeability test was visually observed. When separation was not confirmed, the cured film was evaluated as a cured film having excellent adhesion, and represented by "○." When separation was confirmed, the cured film was evaluated as a cured film having low adhesion, and represented by "×."

Evaluation results are shown in Tables 1 and 2. In Table 2, "–" represents a case wherein a sufficiently cured film was not obtained and evaluation impossible.

TABLE 1

| | Heat-Resistant Transparency | Sulfur Gas Permeability | Adhesion |
|---|---|---|---|
| Example 1 | ○ | ○ | ○ |
| Example 2 | ○ | ○ | ○ |
| Example 3 | ○ | ○ | ○ |
| Example 4 | ○ | ○ | ○ |
| Example 5 | ○ | ○ | ○ |
| Example 6 | ○ | ○ | ○ |
| Example 7 | ○ | ○ | ○ |
| Example 8 | ○ | ○ | ○ |

TABLE 2

| | Heat-Resistant Transparency | Sulfur Gas Permeability | Adhesion |
|---|---|---|---|
| Comparative Example 1 | X | X | ○ |
| Comparative Example 2 | X | X | ○ |
| Comparative Example 3 | X | X | ○ |
| Comparative Example 4 | X | X | ○ |
| Comparative Example 5 | X | X | ○ |
| Comparative Example 6 | X | X | ○ |
| Comparative Example 7 | — | — | — |
| Comparative Example 8 | X | X | ○ |
| Comparative Example 9 | ○ | X | X |
| Comparative Example 10 | — | — | — |

As shown in Table 1, all the cured films obtained from the sealing material compositions for an LED prepared in Examples 1 to 8 had heat-resistant transparency and low sulfur gas permeability. Discoloration of the silver substrate was not continued. The cured films exhibited high adhesion to the silver substrate.

In contrast, as shown in Table 2, any of the cured films obtained from the sealing material compositions for an LED prepared in Comparative Examples 1 to 10 did not satisfy all the heat-resistant transparency, sulfur gas permeability, and adhesion. Specifically, for the cured films obtained from the sealing material compositions for an LED prepared in Comparative Examples 1 to 6 in which polysiloxanes of A-4 to A-9, respectively, were used, there were problems in which the transmittance was decreased and cracking occurred during evaluation of heat-resistant transparency. For the cured films obtained from the sealing material compositions for an LED prepared in Comparative Examples 1 to 6, discoloration of the silver substrate was observed in the evaluation of sulfur gas permeability. Therefore, the sealing material compositions for an LED were judged to be unusable. The sealing material composition for an LED prepared in Comparative Example 7 in which the (A) component was not contained was cracked immediately after formation of the cured film. Therefore, evaluations of heat-resistant transparency, sulfur gas permeability, and adhesion were not carried out. The cured film obtained from the sealing material composition for an LED prepared in Comparative Example 8 in which the (B) component was not contained was cracked during evaluations of heat-resistant transparency and sulfur gas permeability. The cured film obtained from the sealing material composition for an LED prepared in Comparative Example 9 in which the (C) component was not contained was separated from the silver substrate during evaluation of sulfur gas permeability. After formation of the cured film from the sealing material composition for an LED prepared in Comparative Example 10 in which the (D) component was not contained, tack was left on a surface of the film. Therefore, curing of the sealing material composition for an LED was judged to be incomplete, and the subsequent evaluation was not carried out.

As seen from the results described above, the cured film obtained from the sealing material composition for an LED of the present invention has heat-resistant transparency and low sulfur gas permeability, and therefore, exhibits high adhesion to the silver substrate without corrosion of the silver substrate. Accordingly, the sealing material composition for an LED is suitable as a sealant of an LED element in an LED device.

INDUSTRIAL APPLICABILITY

The cured film obtained from the sealing material composition for an LED of the present invention has heat-resistant transparency and low sulfur gas permeability without corrosion of the silver substrate, and exhibits high adhesion to a silver substrate. Therefore, the sealing material composition for an LED is suitable as a sealant of an LED in an LED device, and a protecting agent for a silver electrode and silver plating of a substrate in a liquid crystal end part.

The invention claimed is:

1. A sealing material composition for an LED, the composition comprising the following (A), (B), (C), and (D) components:
    (A) component: a polysiloxane containing structural units of Formulae (1-1), (1-2), and (1-3):

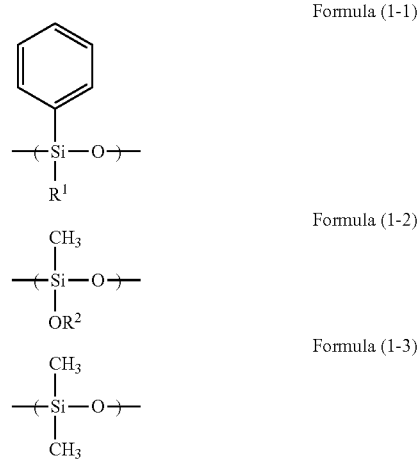

(wherein $R^1$ is a $C_{1-12}$ alkyl group or a $C_{6-20}$ aryl group, $R^2$ is a hydrogen atom, a $C_{1-12}$ alkyl group, or a Si atom constituting a main chain of the polysiloxane as the (A) component, and the ratio of the number (s) of the unit structure of Formula (1-1), the ratio of the number (m) of the unit structure of Formula (1-2), and the ratio of the number (n) of the unit structure of Formula (1-3) satisfy $0.3 \leq s \leq 0.65$, $0.25 \leq m \leq 0.4$, and $0.1 \leq n \leq 0.3$, respectively, relative to the total number of all the unit structures constituting the polysiloxane as the (A) component of 1.0;

(B) component: a polysiloxane containing structural units of Formulae (2-1), (2-2), and (2-3):

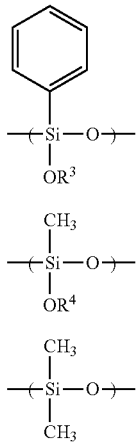

Formula (2-1)

Formula (2-2)

Formula (2-3)

(wherein $R^3$ and $R^4$ are each a hydrogen atom, a $C_{1-12}$ alkyl group, or a Si atom constituting a main chain of the polysiloxane as the (B) component, and the ratio of the number (t) of the unit structure of Formula (2-1), the ratio of the number (p) of the unit structure of Formula (2-2), and the ratio of the number (q) of the unit structure of Formula (2-3) satisfy $0.1 \leq t \leq 0.5$, $0.1 \leq p \leq 0.5$, and $0.1 \leq q \leq 0.5$, respectively, relative to the total number of all the unit structures constituting the polysiloxane as the (B) component of 1.0;

(C) component: an adhesive; and (D) component: a condensation catalyst for a silanol group.

2. The sealing material composition for an LED according to claim 1, wherein $R^1$ in the (A) component is a phenyl group or a methyl group.

3. The sealing material composition for an LED according to claim 1, wherein the polysiloxane as the (A) component has a weight average molecular weight of 1,000 to 5,000.

4. The sealing material composition for an LED according to claim 1, wherein the polysiloxane as the (B) component has a weight average molecular weight of 1,000 to 5,000.

5. The sealing material composition for an LED according to claim 1, wherein the mixing ratio by mass of the (A) and (B) components is 0.2:0.8 to 0.8:0.2.

6. The sealing material composition for an LED according to claim 1, wherein the adhesive as the (C) component is a silane having a mercapto group.

7. The sealing material composition for an LED according to claim 1, wherein the condensation catalyst for a silanol group as the (D) component is an organometal compound.

8. The sealing material composition for an LED according to claim 1, further comprising phenyltrialkoxysilane as an (E) component.

9. An LED device comprising an LED element sealed with a cured product obtained by curing the sealing material composition for an LED according to claim 1.

* * * * *